United States Patent [19]

Cuthbert et al.

[11] Patent Number: 4,788,117
[45] Date of Patent: Nov. 29, 1988

[54] SEMICONDUCTOR DEVICE FABRICATION INCLUDING A NON-DESTRUCTIVE METHOD FOR EXAMINING LITHOGRAPHICALLY DEFINED FEATURES

[75] Inventors: John D. Cuthbert, Bethlehem; Dennis E. Schrope; Tungsheng Yang, both of Lower Macungie Township, Lehigh County, all of Pa.

[73] Assignee: American Telephone and Telegraph Company, AT&T Bell Laboratories, Murray Hill, N.J.

[21] Appl. No.: 7,560

[22] Filed: Jan. 28, 1987

[51] Int. Cl.$^4$ .............................................. G03C 5/00
[52] U.S. Cl. ................................... 430/30; 430/311; 430/326; 430/394
[58] Field of Search ................. 430/30, 311, 328, 331, 430/394, 326; 427/8

[56] References Cited

U.S. PATENT DOCUMENTS 4,591,540 5/1986 Bohlen et al. .................... 430/22

OTHER PUBLICATIONS

Walker, "Reduction of Photoresist Standing-Wave Effects by Post-Exposure Bake," IEEE on Electron Devices, Jul. 1975.
Briggs et al., "Method of Artwork Generation", IBM Tech. Dis. Bull., vol. 21(5), Oct. 1978, pp. 1926-1927.

Primary Examiner—José G. Dees
Attorney, Agent, or Firm—James H. Fox

[57] ABSTRACT

A non-destructive double exposure method of examining photoresist features in section by, e.g., scanning electron microscopy, is described.

3 Claims, 3 Drawing Sheets

SEMICONDUCTOR DEVICE FABRICATION INCLUDING A NON-DESTRUCTIVE METHOD FOR EXAMINING LITHOGRAPHICALLY DEFINED FEATURES

TECHNICAL FIELD

This invention relates generally to the field of semiconductor device fabrication and particularly to a fabrication method which includes a step of nondestructively examining lithographically defined features during the manufacturing process. The nondestructive method, which may include measurement of features as part of the examination, has been termed the photocleave process.

BACKGROUND OF THE INVENTION

As semiconductor ingetrated circuits (ICs) are made with still smaller features, control over processing parameters becomes both more difficult and critical. For example, the permissible variations in device feature sizes become smaller as the feature sizes are reduced. Other examples will be readily apparent to those skilled in the art.

Integrated circuits are typically manufactured by exposing selected portions of a resist, which covers an underlying substrate, to radiation. The resist is then developed, and depending upon whether the resist is positive or negative, the exposed or unexposed portions of the resist are removed. The resist patterns are transferred into the substrate material using such processes as dry etching or ion implantation to thereby form the IC device features. The term "substrate" is used by us to mean the material underlying the resist.

In general, the dimensional control over IC device features is dependent on control of both the lateral dimensions and the profiles, i.e., line edge shapes, of the resist features. While the reason for the dependence on the lateral resist dimensions is obvious, the reason for the dependence on resist profiles is subtle and depends on the precise pattern transfer process used. Thus, it is important to be able to examine not only the lateral dimensions of resist features, but also their profiles, especially at or near the resist-substrate interface. Unfortunately, examination of the resist profiles of features which are either enclosed or near other features, is difficult and may require the destruction of the wafer.

The examination of holes in resists, used to form electrical contacts within the IC, is especially difficult when such holes have lateral dimensions less than 1.0 μm and are defined in resist with a typical thickness greater than 1.0 μm. In order to ensure that the holes are etched into the substrate material immediately under the resist, typically an oxide, with the proper dimensions, it is usually necessary to determine that the profiles forming the holes in resist are close to vertical, that there is no resist remaining at the bottom of the holes, and that the dimensions at the bottoms of the holes are within prescribed limits. If these conditions on the resist features are not met, the pattern transfer will be imperfect and serious loss in device yield will occur, resulting in unwanted expenses.

There are two examination techniques generally used within the IC fabrication industry at the present time. Optical techniques are generally satisfactory for contact windows with diameters greater than 2.0 μm. However, windows smaller than 2.0 μm in diameter generally have an aspect ratio, i.e., ratio of window diameter to resist thickness, comparable to the numerical aperture, typically approximately 0.9, of the microscope objective lens used to observe the holes. Consequently, it is difficult to interpret the optical image when focusing below the top of the hole and examination of the bottom of the hole is impractical.

Techniques using scanning electron microscopes (SEMs) offer better performance than do optical techniques because the use of shorter wavelength radiation allows the use of much smaller numerical apertures. Both high and low voltage SEMs are presently used for IC examination.

High voltage, approximately 20 KeV, SEMs give excellent micrograph images of resist features but generally require deposition of a conductive coating on the wafer to avoid the deleterious effects of charging. Optimized micrographs can be used to determine the dimensions of the contact windows in resist. However, if, as is frequently the case, the aspect ratio of such windows exceeds unity, it is necessary to mechanically cleave the substrates and examine window cross-sections for unambiguous results.

Low voltage SEMs can be used to examine resist samples without a conductive coating, but with a loss of image contrast. The best results are obtained with the wafer tipped almost 40° from the incident electron beam. The tilting, which minimizes charging, is not possible when examining high aspect ratio contact windows because the bottom of the contact window is obscured. Mechanical cleavage of the wafer to reveal window cross-sections is the standard procedure if unambiguous results are desired.

However, mechanical cleaving has several major disadvantages in practice. Some disadvantages relate to cost. The procedure destroys the wafers and it is thereby costly. Preparation of cleaved wafers can be especially lengthy and, therefore, costly, if the IC does not have a regular array of contact windows to cleave through. Most logic array chips are of this type. The lengthy cleaving procedure can delay the manufacturing process until results are obtained, with a cost increment. Additionally, the procedures discussed do not automatically provide for a suitable metric, within the field of view of the examination system, for calibration purposes. This reduces the accuracy of measurement, since it relies on prior calibration of the SEM under observation conditions that are frequently not precisely duplicated during the examination. Precise measurement is therefore difficult because surface charging conditions and details of the beam focus can alter the calibration.

SUMMARY OF THE INVENTION

We have found that integrated circuit features may be nondestructively examined in resist by first exposing the resist in the normal manner through a mask and then exposing the resist a second time at an advantageously smaller exposure energy. The first exposure uses a mask which defines features identical to those features present in the integrated circuit and associated test pattern, if any. The second exposure uses a mask, which may be the same as that used for the first exposure or different, having edge type features which are aligned so that an edge of the features intercepts the integrated circuit resist features whose cross sections will be examined. In a preferred embodiment, the second exposure is done without any prior processing of the resist. After completion of the second exposure, the wafer is developed thereby generating the desired cross section of the integrated circuit resist feature. The generic process will be referred to as the photocleave process and the resulting resist features as having been photocleaved. If the resist feature definition is deemed adequate upon examination of the photocleave, further processing of the wafer examined, as well as other wafers in the lot, may be done. Otherwise, the processing sequence may be terminated or the wafers may be subjected to reworking.

BRIEF DESCRIPTION OF THE DRAWING

For reasons of clarity, the figures are not drawn to scale. Identical numerals in different figures represent identical elements.

DETAILED DESCRIPTION

An illustrative embodiment of our invention will be described in schematic detail. A single wafer from a lot having a plurality of wafers is examined. It is to be understood that the term "examine" is used broadly and may include, for example, measurement of feature sizes.

Figure 1:
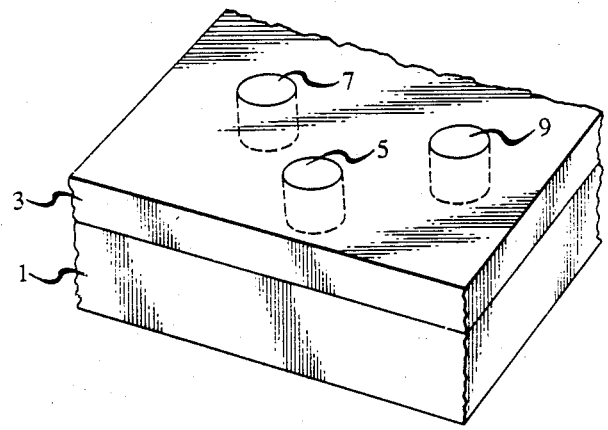
FIGS. 1-2 are useful in explaining our invention prior to resist development.

FIG. 1 shows a substrate 1 onto which a positive resist 3 has been spun in conventional manner. The substrate 1 may be patterned, and therefore not flat. The resist 3 has been exposed with radiation, such as ultraviolet light, through a mask, in a manner well known to those in the semiconductor industry. The mask defines featurs which are identical to features present in active integrated circuit devices. In FIG. 1, the boundaries of the exposed features 5, 7, and 9, commonly referred to as latent images and, in this case, holes in a positive resist, are shown. It should be understood that the features are latent images and thus, not evident upon visual exmination. Of course, many more features may be present.

Figure 2:
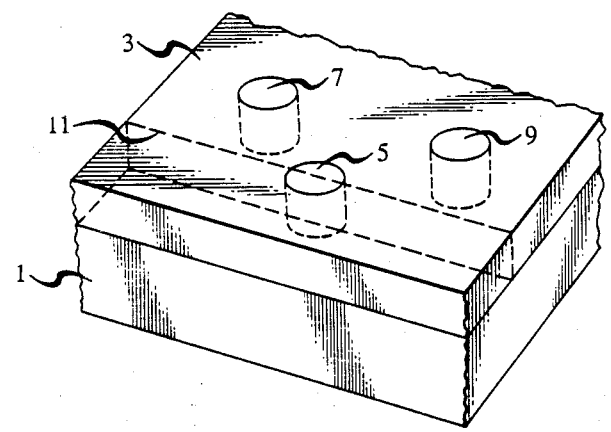

In a preferred embodiment, the resist is exposed again through the same, or a different, mask containing a simple edge-type feature. The latent image 11 of the edge-type features is shown superimposed on the latent image 5 in FIG. 2. The alignment of the edge-type feature is such that its latent image 11 intersects the latent image 5 of a hole-feature. In many applications, it is advantageous to arrange for the serial, i.e., pattern of light on resist, image producing the latent image 5 to have as sharp a gradient as possible. The doubly exposed photoresist is then developed in conventional and well known manner.

Figure 3:
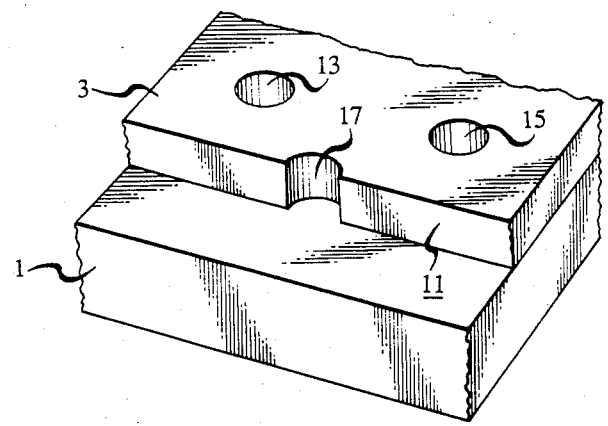
FIGS. 3-4 illustrate photocleaved features.

The resulting resist features remaining on the substrate 1 after development are shown schematically in FIG. 3. It is seen that the latent images 7 and 9 have developed into contact holes 13 and 15 in resist. Latent image 5 has developed into a cleaved contact hole 17 in resist with all resist forward of the surface 11 removed. As mentioned previously, we refer to the contact window as having been photocleaved and the process for achieving this as the photocleave process. The photocleaved window can be easily examined with a SEM, advantageously with the wafer appropriately tipped. The photocleaved window can be examined for incomplete removal of resist at the bottom of the window, and the resist profile at the resist-substrate interface evaluated. The diameter of the window can also be measured if the cleaving is done across an appropriate chord of the cleaved contact window. If the information derived from the examination is adequate, i.e., the feature is adequately defined, device fabrication may proceed. That is, processing of the wafers in the lot continues.

The schematic diagrams do not show the effects of standing wave interference effects which generally cause the walls of the resist forming the windows and the photocleaved surface to be corrugated. The presence of such standing waves will not reduce the value of the photocleave, although they can complicate the interpretation of the photocleaved section. However, those skilled in the art will still be able to readily interpret the photocleaved features.

The deposited energy chosen for the photocleave exposure is not critical although it is desirably less than the energy used for the other exposure. If it is desired to remove all the resist in front of the surface 11, the photocleave exposure energy must be larger than the threshold energy, ($E_{th}$), for complete resist removal. Generally a photocleave exposure of about 1.5 $E_{th}$ is advantageous. The location of the photocleave surface 11 relative to the center of the contact window can be chosen to reveal those aspects of the contact window in resist which are of most interest with respect to device fabrication.

Figure 4:
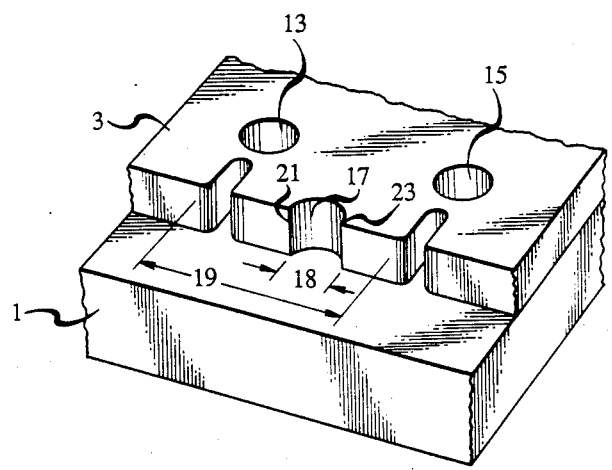

In order to avoid absolute calibration of the instrument used to measure the photocleaved features, the edge-type feature used for photocleaving can incorporate a metric for calibration purposes. An example of a developed contact window cleaved with a linear edge containing a metric 19 for pitch calibration of the SEM measuring tool is shown in FIG. 4. The photocleaved hole has a diameter 18 between corners 21 and 23.

Depending upon the instrumentation used to perform the photocleave exposure, it may be advantageous to perform the second photocleave exposure after the first exposure has been developed. In the case of resist contact window measurement, prior development of the contact window images in positive resist can facilitate the correct alignment of the photocleave mask to the windows.

As will be readily appreciated, the methods described for practicing the photocleave process are nondestructive with respect to the wafer. After the photocleave process, the resist can be stripped off, another resisting coating applied and the wafer returned to the mother lot for reexposure and continuation of the device fabrication sequence for the entire lot.

Of course, it will be readily appreciated by those skilled in the art that features other than holes in resist may be examined. For example, line segments of either tone in positive resist may be examined. Additionally, the order of the two exposures may be reversed. It will also be appreciated that the photocleave operation may be performed several times at different masking levels during the integrated circuit fabrication sequence.

The photocleave process can be applied to lithography based on electron and X-ray exposures provided that positive resists are employed. The photocleave process can be adapted by those skilled in the art to printing with contact, proximity, 1:1 projection, and reduction projection printing methods, as long as positive photoresists are employed.

One skilled in the art might ask why one could not expose the resist once with a mask containing features already sectioned. Referring to the pattern configuration shown in FIG. 4, such a mask would contain a sectioned contact window and metric features. After exposure and development the printed geometries in resist would appear as shown in FIG. 5 rather than as in FIG. 4.

Figure 5:
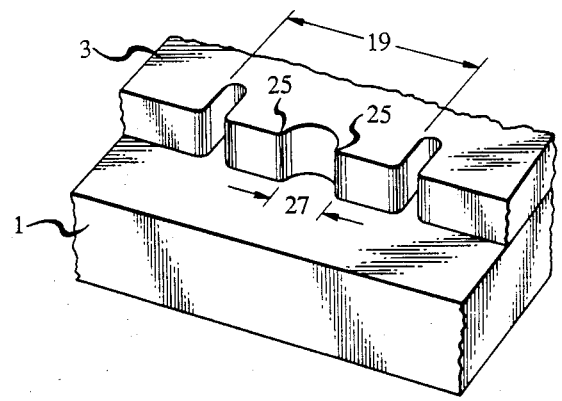
FIGS. 5-7 are useful in explaining the desirability of multiple exposures.

Comparing FIG. 5 with FIG. 4, it will be noticed that there are important differences in detail when using a printer whose resolution is limited. In FIG. 5, the intersections of the linear features with the device feature are not sharp, but rather are rounded, as indicated by the large radii of curvature of the corners 25, compared to the very small radii of curvature of the corners 21 and 23 in FIG. 4 produced by the same printer. Furthermore, the hole diameter 27 measured in FIG. 5 may not be correct because of the large curvature of the corners 25; although it will be correct when measuring the dimension 18 in FIG. 4.

In other words, when using a printing system of limited resolution, two separate exposures are required because one of the exposures must image the device features exactly as they will be printed in the device to avoid subtle feature distortions caused by using a composite mask. If, on the other hand, the printing system has essentially unlimited resolution, the need for a separate photocleave exposure can be avoided, since the radii of the corners 25 in FIG. 5 become very small.

Figure 6:
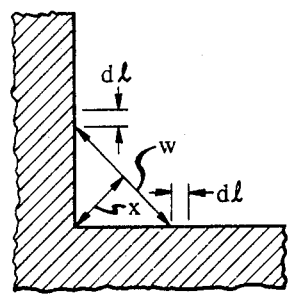
Figure 7:
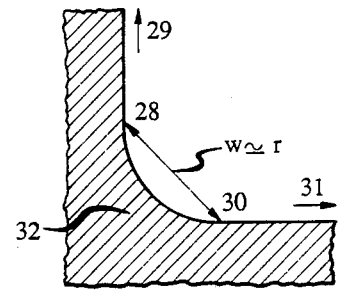

Still further insight into the advantage of a multiple veruss single exposure can be gained by discussing the fundamental reason why the corner of a printed feature is rounded. In FIG. 6, a sharp corner of a feature on the photomask is shown. As perceived by the imaging system within the printer, the corner is comprised of an infinite number of line segments d1 separated by a distance w which is a function of the distance, x, as shown in FIG. 6. When w is larger than the resolution limit, r, of the imaging system, the line segments comprising the corner can be imaged into the resist without distortions. Consequently, referring to FIG. 7, the resist edges comprising the corner are linear in the regions 28–29 and 30–31. When w is less than r, the imaging system cannot project an aerial image of the edge segment with sufficient modulation for the resist to be accurately defined. Since the modulation drops quickly for w less than r, there is insufficient intensity in the aerial image of the segments closer to the nominal location of the corner 32, and a radius appears on the printed corner in resist as shown in FIG. 7.

On the other hand, when such a corner is defined by the intersection of two linear features during separate exposures, the limited resolution of the printer is of no consequence, except for controlling the line edge profiles, and the corner rounding is much reduced.

What is claimed is:

1. A method of semiconductor integrated circuit fabrication comprising the steps of:
    coating a substrate surface of at least one wafer of a lot having a plurality of wafers with a positive resist;
    exposing selectively said resist to radiation at least two times, one of said times defining integrated circuit features, one of said times defining edge type features, at least one of said edge type features overlapping at least one of said integrated circuit features;
    developing said resist;
    examining at least one region where said integrated circuit features and edge type features overlap to produce a photocleave at said integrated circuit features, said photocleave generating a cross section of said integrated circuit features; and
    continuing device fabrication of said wafers of said lot if information derived from the photocleave is adequate.

2. A method as recited in claim 1 in which said integrated circuit feature comprises a hole.

3. A method as recited in claim 1 in which said integrated circuit feature comprises a line segment.

* * * * *